(12) United States Patent
Kikuyama et al.

(10) Patent No.: US 7,727,415 B2
(45) Date of Patent: Jun. 1, 2010

(54) FINE TREATMENT AGENT AND FINE TREATMENT METHOD USING SAME

(75) Inventors: Hirohisa Kikuyama, Osaka (JP); Masahide Waki, Osaka (JP); Kanenori Ito, Sakai (JP); Takanobu Kujime, Sakai (JP); Keiichi Nii, Sakai (JP); Rui Hasebe, Sakai (JP); Hitoshi Tsurumaru, Sakai (JP); Hideki Nakashima, Sakai (JP)

(73) Assignee: Stella Chemifa Corporation, Osaka (JP)

( * ) Notice: Subject to any disclaimer, the term of this patent is extended or adjusted under 35 U.S.C. 154(b) by 381 days.

(21) Appl. No.: 11/722,120

(22) PCT Filed: Dec. 19, 2005

(86) PCT No.: PCT/JP2005/023269
§ 371 (c)(1),
(2), (4) Date: Jun. 19, 2007

(87) PCT Pub. No.: WO2006/068091
PCT Pub. Date: Jun. 29, 2006

(65) Prior Publication Data
US 2008/0029487 A1 Feb. 7, 2008

(30) Foreign Application Priority Data
Dec. 20, 2004 (JP) .............................. 2004-367831

(51) Int. Cl.
C09K 13/00 (2006.01)
C09K 13/04 (2006.01)
C09K 13/02 (2006.01)

(52) U.S. Cl. ................... 252/79.1; 252/79.2; 252/79.3; 252/79.4; 252/79.5; 438/745; 438/754

(58) Field of Classification Search ................... None
See application file for complete search history.

(56) References Cited

U.S. PATENT DOCUMENTS

| 4,814,293 | A | 3/1989 | Van Oekel |
| 6,451,696 | B1 | 9/2002 | Hara et al. |
| 6,458,657 | B1 * | 10/2002 | Chang ......................... 438/257 |
| 6,547,647 | B2 | 4/2003 | Chang |
| 2002/0072235 | A1 * | 6/2002 | Haga et al. .................. 438/689 |

FOREIGN PATENT DOCUMENTS

| EP | 0 292 057 A1 | 11/1988 |
| EP | 0 986 097 A2 | 3/2000 |
| EP | 1 176 633 | 1/2002 |
| JP | 62-221161 | 9/1987 |
| JP | 63-305518 | 12/1988 |
| JP | 3-53084 | 3/1991 |
| JP | 6-338489 | 12/1994 |
| JP | 2000-138192 | 5/2000 |
| JP | 2001-26890 | 1/2001 |
| JP | 2002-25965 | 1/2002 |
| JP | 2002-53984 | 2/2002 |
| JP | 2004-31791 | 1/2004 |

* cited by examiner

*Primary Examiner*—Duy-Vu N Deo
(74) *Attorney, Agent, or Firm*—Knobbe Martens Olson & Bear LLP

(57) ABSTRACT

A fine treatment agent according to the present invention is a fine treatment agent for the fine treatment of a multilayer film, including a tungsten film and a silicon oxide film comprising at least one from among hydrogen fluoride, nitric acid, ammonium fluoride and ammonium chloride. Thus, a fine treatment agent which makes fine treatment on a multilayer film, including a tungsten film and a silicon oxide film, possible by controlling the etching rate and a fine treatment method using the same can be provided.

15 Claims, No Drawings

FINE TREATMENT AGENT AND FINE TREATMENT METHOD USING SAME

This application is the U.S. National Phase under 35 U.S.C. §371 of International Application PCT/JP2005/023269, filed Dec. 19, 2005, which claims priority to Japanese Patent Application No. 2004-367831, filed Dec. 20, 2004. The International Application was published under PCT Article 21(2) in a language other than English.

TECHNICAL FIELD

The present invention relates to a fine treatment agent which is used for the fine processing or cleaning treatment of the formation of electrodes and wires made of a thin metal film in the manufacture of a semiconductor device, a liquid crystal display or the like, as well as a fine treatment method using the same, and in particular, to a fine treatment agent used in the fine processing of a tungsten film made of tungsten or a tungsten alloy and a silicon oxide film, as well as a fine treatment method using the same.

BACKGROUND ART

Various types of metals and metal oxides are widely used as a general electrode and wire material having a fine multilayer structure in a semiconductor device, a liquid crystal display or the like. Wet etching methods using chemicals as well as dry etching methods, such as ion etching methods and plasma etching methods, are mainly known as conventional fine processing technologies for electrodes and wires using these metals or metal oxides. Different methods from among these methods are selected depending on the type of the metal, the metal oxide or a composite material of these, which is the object of etching, the targeted precision in the fine processing, the manufacturing method and the like.

Wet etching methods do not require an expensive apparatus in comparison with dry etching methods and are economical because only inexpensive chemicals are used. In addition, the effects of the wet etching methods are not affected by the form of the object of etching, and thus, wet etching methods are appropriate for etching an object having a three dimensional structure. Furthermore, metals which are dissolved in the etchant as a result of etching and useful as the electrode and the wire materials can be collected relatively easily from the etchant after use (etching waste), and therefore, wet etching methods are widely adopted from the point of view of effectively using natural resources.

A variety of metals, alloys of these and metal oxides are used as the above described electrode and wire materials for a semiconductor device or a liquid crystal display. Aluminum, molybdenum, titanium, tungsten, zirconia, tantalum, gold, silver, copper and alloys of these metals, for example, can be used as the metal.

Here, as the etchant for tungsten films made of tungsten or a tungsten alloy, a liquid mixture of an alkaline solution and hydrogen peroxide can be cited as an example (see, for example, Japanese Unexamined Patent Publication 2001-26890, Japanese Unexamined Patent Publication 2002-25965, Japanese Unexamined Patent Publication 2002-53984 and Japanese Unexamined Patent Publication 2004-31791).

In the case where the etchant contains hydrogen peroxide, however, the composition of the etchant easily changes due to the decomposition of this hydrogen peroxide, and thus, there is a problem with its stability as a chemical. In addition, in the case where an etchant for etching a multilayer film of, for example, a tungsten film and a silicon oxide film is made of only alkaline solutions, there is a problem that the silicon oxide films cannot be etched. Furthermore, the difference in the etching rate between the tungsten film and the silicon oxide film causes a problem where the form after etching becomes poor, the surface of the substrate becomes coarse through etching or etching is carried out unevenly.

Patent Document 1: Japanese Unexamined Patent Publication 2001-26890
Patent Document 2: Japanese Unexamined Patent Publication 2002-25965
Patent Document 3: Japanese Unexamined Patent Publication 2002-53984
Patent Document 4: Japanese Unexamined Patent Publication 2004-31791

DISCLOSURE OF THE INVENTION

Problem to be Solved by the Invention

The present invention is provided in view of the above described problems, and an object thereof is to provide a fine treatment agent, which is used to finely process a tungsten film and a silicon oxide film layered on a substrate and makes it possible to carry out fine treatment simultaneously or selectively on the tungsten film and the silicon oxide film, as well as to provide a fine treatment method using the same.

Means for Solving Problem

The present inventors diligently examined fine treatment agents and fine treatment methods using the same in order to solve the above described problems with the prior art. As a result, it was found out that it becomes possible to control the etching rate by adopting the following configuration when fine treatment is carried out on a multilayer film having a tungsten film and a silicon oxide film, and thus, the present invention is completed.

That is to say, in order to achieve the above described object, the present invention provides a fine treatment agent which is used for the fine processing of a multilayer film including a tungsten film and a silicon oxide film comprising hydrogen fluoride, nitric acid and at least one of ammonium fluoride and ammonium chloride.

In the above described configuration, it is preferable for the etching rate for the above described tungsten film at 25° C. to be within a range from 0.5 nm/min to 5000 nm/min and for the etching rate for the above described silicon oxide film at 25° C. to be within a range from 0.5 times to 2 times the etching rate for the above described tungsten film at 25° C.

In the case where the difference in the etching rate between the silicon oxide film and the tungsten film is great, the form of the pattern of the tungsten film after fine processing and the form of the pattern of the silicon oxide film become uneven. That is to say, the width of the trenches created in the tungsten film and the silicon oxide film may be different, so that steps are created, or the form on the side wall surfaces of the trenches may be lost, for example. In the above described configuration, however, the etching rate for the silicon oxide film (25° C.) is controlled so as to be within a range from 0.5 times to 2 times greater than the etching rate for the tungsten film (25° C.), and therefore, it becomes possible to finely process the tungsten film and the silicon oxide film at the same time with high precision while preventing the form of the pattern from becoming uneven as much as possible. Furthermore, fine processing can be carried out on the surface of the substrate while preventing the roughness on the surface from becoming great by controlling the etching rate, and thus, it becomes possible to provide a smooth and clean surface on the substrate by reducing defects.

In addition, the etching rate of the fine treatment agent having the above described configuration for the tungsten film (25° C.) is within a range from 0.5 nm/min to 5000 nm/min, and therefore, the time for processing for the fine treatment on the tungsten film can be prevented from becoming long, and thus, increase in the efficiency during production can be achieved.

In the above described fine treatment agent, it is preferable for X, Y and Z to satisfy the following relational expressions when the content of the above described hydrogen fluoride is X mol/kg, the content of the nitric acid is Y mol/kg and the content of either the ammonium fluoride or the ammonium chloride is Z mol/kg.

[Formula 1]

$$Z \leq 1.25Y - 1.75 \quad (1)$$

$$Z > 1.4Y - 3 \quad (2)$$

$$Z \leq -0.973Y + 0.108 \times (100 - 4X) \quad (3)$$

$$0.5 \leq X \leq 10, Y > 0, 0 < Z \leq 6 \quad (4)$$

As a result, it becomes possible for the etching rate for the silicon oxide film at 25° C. to be within a range from 0.5 times to 2.0 times greater than the etching rate for the tungsten film at 25° C. in the case where the etching rate for the tungsten film at 25° C. is within a range from 0.5 nm/min to 5000 nm/min.

In addition, in the above described configuration, it is preferable for the etching rate for the above described tungsten film at 25° C. is within a range from 0.5 nm/min to 5000 nm/min and the etching rate for the above described silicon oxide film at 25° C. is either less than 0.5 times or greater than 2 times the etching rate for the above described tungsten film at 25° C.

The fine treatment agent having the above described configuration allows the etching rate for the silicon oxide film (25° C.) to be controlled so as to be less than 0.5 times or more than 2 times the etching rate for the tungsten film (25° C.), making the difference in the etching rates for the two greater, and therefore, selective fine processing becomes possible on the tungsten film or the silicon oxide film. In addition, control of the film thickness of the tungsten film or silicon oxide film also becomes possible. Furthermore, control of the etching rate makes it possible to prevent the roughness on the surface of the substrate from becoming great, as well as to carry out fine processing, and thus, it becomes possible to reduce the number of defects and provide a smooth and clean surface on the substrate. In addition, the etching rate for the tungsten film (25° C.) is within a range from 0.5 nm/min to 5000 nm/min, and therefore, the time for processing the fine treatment on the tungsten film can be prevented from becoming long, and thus, increase in the efficiency during production can be achieved.

In the above described fine treatment agent, it is preferable for X, Y and Z to satisfy the following relational expressions when the content of the above described hydrogen fluoride is X mol/kg, the content of the nitric acid is Y mol/kg and the content of either the ammonium fluoride or the ammonium chloride is Z mol/kg.

[Formula 2]

$$Z \leq -0.973Y + 0.108 \times (100 - 4X) \quad (3)$$

$$0.5 \leq X \leq 10, Y > 0, 0 < Z \leq 6 \quad (4)$$

$$Z \leq 1.4Y - 3 \quad (5)$$

The content of nitric acid and at least one of ammonium fluoride and ammonium chloride satisfies the above described relational expressions in the configuration, and thus, it becomes possible for the etching rate for the silicon oxide film at 25° C. to be in a range of less than 0.5 times or more than 2 times the etching rate for the tungsten film at 25° C. in the case where the etching rate for the tungsten film at 25° C. is within a range from 0.5 nm/min to 5000 nm/min.

It is preferable for the main component of the above described tungsten film to be at least one type selected from the group consisting of tungsten, titanium tungsten, copper tungsten, nickel tungsten, cobalt tungsten, molybdenum tungsten, tungsten silicide and tungsten nitride.

In addition, in the above described fine treatment, it is preferable for the above described silicon oxide film to be a single layer of one type selected from the group consisting of a silicon thermal oxide film, a non-doped silicate glass film, a phosphorous doped silicate glass film, a boron doped silicate glass film, a phosphorous and boron doped silicate glass film, a TEOS film, a fluorine containing silicon oxide film, a carbon containing silicon oxide film, a silicon nitride oxide film and a natural oxide film, or a multilayer film of two or more types selected from the group.

In addition, in the above described fine treatment agent, it is preferable for the etching rate for the above described silicon oxide film at 25° C. to be within a range from 0.5 nm/min to 5000 nm/min. As a result, the time for processing the fine treatment on the silicon oxide film can be prevented from becoming long, and thus, increase in the efficiency during production can be achieved, and control of the film thickness and the roughness on the surface of the silicon oxide film becomes easy after fine processing.

In the above described fine treatment agent, it is preferable for 0.001 weight percent to 0.1 weight percent of a surfactant to be contained. As a result, the surface of the substrate, on which fine treatment has been carried out, can further be prevented from becoming coarse. In addition, the wettability on the surface of the substrate can be improved by adding the surfactant, and thus, it becomes possible to carry out uniform fine processing on the surface of the substrate.

In addition, in order to achieve the above described object, the present invention provides a fine treatment method according to which at least one of a tungsten film and a silicon oxide film is finely processed by using the above described fine treatment agent.

In accordance with the above described method, a fine treatment agent with which the etching rate for the tungsten film (25° C.) is 0.5 nm/min to 5000 nm/min is used, and therefore, the time for processing the fine treatment on the tungsten film can be prevented from becoming long, making increase in the efficiency during production possible. In addition, in the case where the above described fine treatment agent allows the etching rate for the silicon oxide film (25° C.) to be controlled within a range from 0.5 times to 2 times the etching rate for the tungsten film (25° C.), the tungsten film and the silicon oxide film can be finely processed at the same time and with high precision, and thus, the fabrication yield can be increased. Meanwhile, in the case where the etching rate for the silicon oxide film is controlled so as to be less than 0.5 times or more than 2 times the etching rate for the tungsten film, it becomes possible to carry out selective fine processing on the tungsten film or silicon oxide film with high precision.

Effects of the Invention

The present invention provides the above described means, and thus, the effects described below can be gained.

That is to say, the present invention provides a fine treatment agent having a configuration which includes hydrogen fluoride, nitric acid and at least one of ammonium fluoride and ammonium chloride, and thus, it becomes possible to carry out fine processing on a multilayer film which includes a tungsten film and a silicon oxide film in such a manner that both the tungsten film and the silicon oxide film are processed at the same time, or only one is selectively processed. In addition, the form of the fine processing pattern can be prevented from becoming inconsistent due to the difference in the etching rate between the tungsten film and the silicon oxide film. As a result, controllability of the form becomes excellent, and increase in the precision during processing can be achieved. Furthermore, the roughness on the surface of the substrate can be prevented from becoming great, and therefore, it becomes possible to reduce the number of defects and provide a smooth and clean surface on the substrate. As a result, it becomes possible to increase the fabrication yield.

BEST MODE FOR CARRYING OUT THE INVENTION

Embodiment 1

One embodiment of the present invention is described in the following.

The fine treatment agent according to the present invention is formed so as to include at least hydrogen fluoride, nitric acid and at least one of ammonium fluoride and ammonium chloride (hereinafter referred to as "ammonium fluoride or the like"), and is used when finely processing a tungsten film and a silicon oxide film which are layered on a substrate. Fine processing means etching of a tungsten film and a silicon oxide film and cleaning the surface of these.

It is a necessary requirement for the fine treatment agent according to the present embodiment to have an etching rate within a range from 0.5 nm/min to 5000 nm/min for a tungsten film at 25° C. In the case where the etching rate is less than 0.5 nm/min, the fine treatment, for example etching, takes time, making the efficiency during production low. In addition, in the case where the etching rate exceeds 5000 nm/min, control in the film thickness after etching becomes difficult, and the roughness on the surface of the substrate (surface on the side opposite to the surface on which the tungsten film and the like are formed) becomes significant, and thus, the fabrication yield becomes low. Furthermore, it is preferable for the etching rate for the above described tungsten film to be within a range from 5 nm/min to 5000 nm/min, it is more preferable for it to be within a range from 100 nm/min to 5000 nm/min, and it is particularly preferable for it to be within a range from 400 nm/min to 5000 nm/min.

In addition, the above described fine treatment agent allows the etching rate for the silicon oxide film at 25° C. to be controlled within a range from 0.5 times to 2 times the etching rate for the tungsten film at 25° C. An etching rate within the above described range of numerical values makes it possible to prevent steps from being created in the interface between the silicon oxide film and the tungsten film, as well as to prevent the form of the side wall surfaces from being lost in contact holes and trenches created in the silicon oxide film and the tungsten film, for example. As a result, controllability of the form becomes excellent, and it becomes possible to process the tungsten film and the silicon oxide film at the same time. Here, the fine treatment agent according to the present embodiment contains ammonium fluoride, and therefore, swelling and peeling of a resist film as caused when an etchant based on only hydrofluoric acid is used can be prevented, and effects of protecting the resist film can be gained.

Here, the etching rate for the silicon oxide film at 25° C. is controlled within a range from 0.5 times to 2 times the etching rate for the tungsten film at 25° C., and therefore, X, Y and Z satisfy the following relational expressions when the content of hydrogen fluoride is X mol/kg, the content of nitric acid is Y mol/kg and the content of ammonium fluoride is Z mol/kg.

[Formula 3]

$$Z \leq 1.25Y - 1.75 \quad (1)$$

$$Z > 1.4Y - 3 \quad (2)$$

$$Z \leq -0.973Y + 0.108 \times (100 - 4X) \quad (3)$$

$$0.5 \leq X \leq 10, Y > 0, 0 < Z \leq 6 \quad (4)$$

In addition, in the fine treatment agent according to the present embodiment, X', Y' and Z' satisfy the following relational expressions when the concentration of the hydrogen fluoride solution is X' mol/kg and the concentration of at least one of the ammonium fluoride solution and the ammonium chloride solution (hereinafter referred to as "ammonium fluoride solution or the like") is Z' mol/kg.

[Formula 4]

$$Z' \leq 1.25Y' - 1.75 \quad (1')$$

$$Z' > 1.4Y' - 3 \quad (2')$$

$$Z' \leq -0.973Y' + 0.108 \times (100 - 4X') \quad (3')$$

$$0.5 \leq X' \leq 10, Y' > 0, 0 < Z' \leq 6 \quad (4')$$

The content of hydrogen fluoride, nitric acid and ammonium fluoride or the like, and the concentration of the hydrogen fluoride solution and the ammonium fluoride solution or the like satisfy the above described conditions, the etching rate for the silicon oxide film at 25° C. becomes within a range from 0.5 times to 2 times the etching rate for the tungsten film, and thus, the fine treatment agent is appropriate for use in fine processing of multilayer films containing a tungsten film and a silicon oxide film. As an example where the etching rate for the silicon oxide film at 25° C. is greatly different from the etching rate for the tungsten film, an etchant for a tungsten film made of sodium hydroxide and hydrogen peroxide can be cited. In the case of this etchant, however, the silicon oxide film is barely etched. Use of the fine treatment agent according to the present invention as an etchant makes it possible to etch a tungsten film and a silicon oxide film at the same time, and also allows for control of selective etching between the tungsten film and the silicon oxide film, and therefore, the fine treatment agent has excellent performance in comparison with the etchants of the prior art, in terms of fine processing on multilayer films.

In addition, it is preferable for the etching rate of the fine treatment agent according to the present embodiment for a silicon oxide film at 25° C. to be controlled within a range from 0.5 nm/min to 5000 nm/min. This is because in the case where the etching rate is less than 0.5 nm/min, time is required for the fine treatment, for example etching, as in the case of a tungsten film, and sometimes the efficiency during production is reduced. In addition, in the case where the etching rate exceeds 5000 nm/min, control of the film thickness after etching becomes difficult, and the roughness on the surface of the substrate (surface on the side opposite to the surface where a tungsten film or the like is formed) becomes significant, and thus, sometimes the fabrication yield becomes low. It is more preferable for the etching rate for the above described silicon oxide film to be within a range from 1 nm/min to 1000 nm/min, and it is particularly preferable for the etching rate to be within a range from 1 nm/min to 500 nm/min.

The content Z (mol/kg) of ammonium fluoride or the like included in the fine treatment agent is $0.01 \leq Z \leq 6$, and therefore, it can be said that the fine treatment agent according to the present embodiment is buffered hydrofluoric acid (BHF) having a low ammonium fluoride composition. The content of ammonium fluoride or the like Z is controlled within the above described range of numerical values, and thus, the solubility in the product created at the time of etching (for example ammonium silicofluoride) can be increased, so that defects caused by etching can be prevented. In addition, the temperature at which crystal deposits can be greatly lowered without changing the etching rate, and therefore, no such problems as crystal depositing, for example during winter, arise.

It is preferable to add a surfactant to the fine treatment agent according to the present embodiment. As the above described surfactant, non-ionic surfactants, such as polyethylene glycol alkyl ether, polyethylene glycol alkyl phenyl ether, polyethylene glycol aliphatic ester, polyoxyalkylene alkyl ether, polyoxyethylene styrenated phenyl ether, polyoxyethylene alkyl sulfate, polyoxyethylene alkyl benzene sulfate, polyoxyethylene polyoxypropylene block polymer, fatty acid diethanolamide, polyoxyethylene oleate ether, polyoxyethylene distearate ether, polyoxyethylene castor oil and polyoxyethylene sorbitan fatty acid ester, can be cited as appropriate surfactants. In addition, the surfactant may be used in an aliphatic alcohol, an aliphatic carboxylic acid or an aliphatic carboxylate, or one type from among aliphatic amine salts or a mixture of two or more types, and the state thereof may be solid or liquid. Here, the surface active performance for the same amount added tends to be weak in comparison with the above described non-ionic surfactants.

It is preferable for the amount of the above described surfactant added to be within a range from 0.001 weight % to 0.1 weight %, and it is more preferable for it to be within a range from 0.005 weight % to 0.03 weight %. Coarseness on the surface of tungsten films, silicon oxide films and the semiconductor substrate on which etching treatment has been carried out can be prevented by adding a surfactant. Furthermore, conventional etchants easily remain at localized areas on the surface of semiconductor substrates where a fine pattern has been formed when the degree of integration increases a great deal, and it becomes more difficult to carry out etching uniformly when the intervals in the pattern on the resist becomes approximately 0.5 μm or less. In the case where the fine treatment agent according to the present invention, to which a surfactant has been added, is used as an etchant, however, the wettability on the surface of the semiconductor substrate improves, and the uniformity of etching on the surface of the substrate increases. Here, in the case where the above described added amount is less than 0.001 weight %, the surface tension of the fine treatment agent does not lower sufficiently, and thus, the effects of increasing the wettability sometimes become insufficient. In addition, in the case where the above described added amount exceeds 0.1 weight %, no additional effects can be gained for the excessive part, and in addition, the antifoaming properties deteriorate, and foam attaches to the surface to be etched, and thus, etching sometimes becomes inconsistent and etching becomes poor, due to foam entering into fine spaces.

It is possible to mix an additive other than a surfactant with the fine treatment agent according to the present embodiment, as long as it does not hinder the effects. As the above described additive, hydrochloric acid (and solutions thereof), acid materials, such as sulfuric acid solutions and phosphoric acid solutions, hydrogen peroxide and chelates can be cited as examples.

The metal elements included in the fine treatment agent according to the present invention are not particularly limited, and it is appropriate for the content thereof to be no more than 1 ppb, for the purpose of suppressing loss of the electrical properties of the semiconductor to the minimum, and it is more preferable for it to be no more than 0.5 ppb. The metal elements included in the fine treatment agent can be analyzed using an inductively coupled radiofrequency plasma emission mass spectrometer (trade name: ICP-MS HP-4500, made by Yokogawa Hewlett-Packard Co., Ltd.).

The fine treatment agent according to the present embodiment can be manufactured using various conventionally known methods, so that the etching rate for the tungsten film at 25° C. becomes within a range from 0.5 nm/min to 5000 nm/min. Concretely, a method for preparing a mixed solution including hydrogen fluoride and ammonium fluoride by making hydrofluoric acid absorb an ammonium gas through bubbling or surface absorption (or a method for manufacturing an ammonium fluoride solution by making hydrofluoric acid absorb an ammonium gas and mixing this with hydrofluoric acid with a desired ratio) can be cited as an example. In addition, a method for dissolving a highly pure ammonium fluoride powder in hydrofluoric acid and a method for manufacturing a highly pure ammonium solution by making ultrapure water absorb an ammonium gas and after that mixing this ammonium solution with hydrofluoric acid can be cited as another example. From among these manufacturing methods, the method for making hydrofluoric acid absorb an ammonium gas is most preferable, because it allows a fine treatment agent which is purer to be gained. Here, ammonium components may be contained in the liquid, as in the above description, when nitric acid or a mixed liquid of hydrogen fluoride and nitric acid is used instead of hydrofluoric acid.

It is preferable for the concentration of the hydrofluoric acid, nitric acid solution and ammonium fluoride solution used for the mixture to be adjusted so that the above described conditions are satisfied. In addition, the concentration may be adjusted by adding water or the like at the time of mixing, if necessary.

As the above described tungsten film, films of which the main component is tungsten, and tungsten alloy films of which the main component is at least one type selected from among titanium tungsten, copper tungsten, nickel tungsten, cobalt tungsten, molybdenum tungsten, tungsten silicide or tungsten nitride can be cited as examples. In addition, it is possible for only one type of tungsten film to be exposed from the surface so that fine processing can be carried out, or a number of types may be exposed from the surface.

As the above described silicon oxide film, silicon thermal oxide films, non-doped silicate glass films, phosphorous doped silicate glass films, boron doped silicate glass films, phosphorous and boron doped silicate glass films, TEOS films, fluorine containing silicon oxide films, carbon containing silicon oxide films, silicon oxynitride films and natural oxide films can be cited as examples. It is possible for only one type of silicon oxide film to be exposed from the surface, so that etching can be carried out, or a number of types may be exposed from the surface.

In the case where at least one of the tungsten film and the silicon oxide film has an ultra-fine circuit having ultra-fine spaces in the pattern, the effects of the present invention become more significant. That is to say, more significant effects of suppressing roughness on the surface and making etching uniform can be gained.

In addition, in the case where films of a type other than tungsten films and silicon oxide films, for example of copper, aluminum, nickel, titanium, cobalt, tantalum or a compound of these with silicon, nitrogen or oxygen, is layered as the object to be etched, significant effects can be gained in terms of control of the rate of selective etching between the types of films (here, making the etching rate equal) as one effect of the present invention, as comparison to conventional etchants for tungsten.

As the above described substrate on which tungsten films and silicon oxide films are layered, semiconductor wafers and substrates for liquid crystal displays can be cited as examples.

Next, a fine treatment method using the fine treatment agent according to the present embodiment is described, citing wet etching as an example.

The fine treatment agent according to the present embodiment can be adopted in a variety of wet etching methods. As etching methods, there are immersion methods, spray methods and the like, and the fine treatment agent according to the present invention can be adopted in any of these methods. Immersion methods are preferable, because the composition of the fine treatment agent changes little due to evaporation during the etching process.

It is preferable for the temperature for etching to be within a range from 5° C. to 50° C. in the case where the fine treatment agent is used as an etchant, it is more preferable for it to be within a range from 15° C. to 35° C., and it is most preferable for it to be within a range from 20° C. to 30° C. In the case where the temperature for etching is within the above described range, the fine treatment agent can be kept from evaporating, and thus, the composition can be prevented from changing. In addition, demerits such that uniformity is lost due to the roughness on the surfaces of tungsten films and the substrate increasing at high temperatures and increase in the viscosity of the fine treatment agent reducing the effects of cleaning at low temperatures can be avoided. Here, the etching rate changes for different films, depending on the temperature for etching, and therefore, in some cases, the difference between the etching rate for the tungsten film and the etching rate for the silicon oxide film is affected. Accordingly, when the temperature for etching is set, it is desirable for the etching rate for the silicon oxide film to be within a range from 0.5 times to 2 times the etching rate for the tungsten film.

Embodiment 2

Another embodiment of the fine treatment agent according to the present invention is described in the following. Here, detailed description of components having the same functions as the fine treatment agent according to the above described embodiment 1 is omitted.

The fine treatment agent according to the present embodiment is different from the fine treatment agent according to the embodiment 1 in that the etching rate for the silicon oxide film at 25° C. is controlled so as to be less than 0.5 times, or exceed 2 times the etching rate for the tungsten film at 25° C. When the etching rate is within the above described range of numerical values, selective fine processing becomes possible, so that only one of the tungsten film and the silicon oxide film is etched.

Here, in order for the etching rate for the silicon oxide film at 25° C. to be less than 0.5 times or exceed 2 times the etching rate for the tungsten film at 25° C., X, Y and Z must satisfy the following relational expressions, when the content of hydrogen fluoride is X mol/kg, the content of nitric acid is Y mol/kg and the content of ammonium fluoride is Z mol/kg.

[Formula 5]

$$Z \leq -0.973Y + 0.108 \times (100-4X) \quad (3)$$

$$0.5 \leq X \leq 10, Y > 0, 0 < Z \leq 6 \quad (4)$$

$$Z \leq 1.4Y - 3 \quad (5)$$

In addition, in the fine treatment agent according to the present embodiment, X', Y' and Z' satisfy the following relational expressions, when the concentration of the hydrogen fluoride solution is X' mol/kg, the concentration of the nitric acid solution is Y' mol/kg and the concentration of the ammonium fluoride solution is Z' mol/kg.

[Formula 6]

$$Z' \leq -0.973Y' + 0.108 \times (100-4X') \quad (3')$$

$$0.5 \leq X' \leq 10, Y' > 0, 0 < Z' \leq 6 \quad (4')$$

$$Z' \leq 1.4Y' - 3 \quad (5')$$

In the case where the concentrations of the hydrogen fluoride solution, the nitric acid solution and the ammonium fluoride solution satisfy the above described conditions, the etching rate for the silicon oxide film at 25° C. is greatly different from the etching rate for the tungsten film, and thus, it becomes possible to selectively remove only one of the two from the multilayer film. This is particularly preferable in the case where it is desired for only the tungsten film, for example, to be selectively removed.

It is possible to manufacture the fine treatment agent according to the present embodiment in accordance with the same method as that described in the above described embodiment 1. Here, it is preferable for the concentration of the hydrogen fluoride solution, the nitric acid and the ammonium fluoride solution to be prepared so that the above described (3) or (4) is satisfied. In addition, the concentration may be adjusted by adding water or the like at the time of mixture, if necessary.

(Other)

The most preferred embodiments according to the present invention are described above. However, the present invention is not limited to these embodiments, and a variety of modifications are possible within substantially the same scope as the technical idea described in the claims of the present invention.

For example, though the fine surface treatment agent of the present invention contains hydrogen fluoride, nitric acid, ammonium fluoride and the like, a chemical where hydrogen fluoride, nitric acid and ammonium nitrate are added to a solution can be handled as the same chemical containing hydrogen fluoride, nitric acid and ammonium fluoride, as long as the composition of $H^+$ ions, $NH_4^+$ ions, $F^-$ ions and $NO_3^-$ ions is the same.

EXAMPLES

In the following, the preferred examples of this invention are described in detail, in an illustrative manner. Here, the material, the blending quantity and the like described in these examples are not intended to limit the scope of the invention only to these, and are merely examples for description unless otherwise stated.

As for items with values in the present examples, the values are set as follows.

(a) Etching Rate for Silicon Oxide Film

The film thickness of the silicon oxide film was measured before and after etching using an optical type film thickness measuring apparatus ("NanoSpec 6100," made by Nanometrics Incorporated), and the amount of change in the film thickness resulting from etching was measured. The above described measurement was repeated for three or more different times for etching, and thus, the etching rate was calculated.

(b) Etching Rate for Tungsten Film

Etching was carried out on the surface of a tungsten film of which a portion was protected with a coal tar based wax ("Apiezon Wax," made by Nikka Seiko Co., Ltd.), and after that, the wax was peeled off using toluene. Next, the step in the interface between portions in which the wax was applied and portions where no wax was applied was measured on the etched sample using a desktop compact probe microscope ("Nanopcis," made by SII NanoTechnology Inc.), and the amount by which the film thickness reduced as a result of etching was measured. The above described measurement was repeated for three or more different times for etching, and thus, the etching rate was calculated.

(c) Roughness on Surface

An atomic force microscope ("NANOSCOPE III," made by Digital Instruments, Inc.) was used to observe the degree of roughness on the rear surface of the silicon wafer before and after etching under such conditions that the mode was tapping mode.

(d) Uniformity in Etching

A tungsten film was etched from a silicon wafer where layers were layered in sequence so that the film structure became tungsten film/titanium nitride film/titanium film/silicon oxide film, and the tungsten film, which was finely processed to an island form and remained on the titanium nitride film after etching, was observed by the eye. In the case where no interference fringe pattern resulting from remaining tungsten film was observed precisely at the point when etching for the tungsten was finished, "⊚" is used. In the case where an interference fringe pattern was observed, etching continued and the film was overetched and again observed. As a result, in the case where no interference fringe pattern was observed, "○" is used, and in the case where an interference fringe pattern was observed, "X" is used.

Example 1

0.5 weight parts of a non-ionic surfactant (polyethylene glycol alkyl ether) was added to a chemical where 100 weight parts of hydrofluoric acid (highly pure grade for semiconductors; concentration: 50%; made by Stella Chemifa Corporation), 1133 weight parts of a nitric acid solution (grade for use in the electronics industry; concentration: 69.5%; made by Sumitomo Chemical Co., Ltd.), 694 weight parts of an ammonium fluoride solution (highly pure grade for semiconductors; concentration: 40%; made by Stella Chemifa Corporation) and 573 weight parts of ultra-pure water were mixed together, which was then stirred and mixed, and after that, the temperature was adjusted to 25° C. and the mixed liquid was left still for 4 hours. As a result, the etchant (fine treatment agent) according to the present example was gained. The content of hydrogen fluoride, nitric acid and ammonium fluoride was 1 mol/kg, 5 mol/kg and 3 mol/kg, respectively (see Table 1 below). Next, the silicon wafer on which a tungsten film/titanium nitride film/titanium film/silicon oxide film were layered in sequence was immersed in the etchant, and after that, the etching rate for the tungsten film and the silicon thermal oxide film was evaluated. The results are shown in Table 1 below.

Examples 2 to 9 and 11 to 16

In Examples 2 to 9 and 11 to 16, an etchant was prepared in the same manner as in the above described Example 1, except that the content of hydrogen fluoride, nitric acid and ammonium fluoride was changed as shown in Table 1, and after that, a silicon wafer was etched. The results are shown in Table 1 below.

Example 10

In the present Example 10, an etchant was prepared in the same manner as in the above described Example 1, except that the content of hydrogen fluoride, nitric acid and ammonium fluoride was changed as shown in Table 1, and furthermore, no surfactant was added, and after that, a silicon wafer was etched. The results are shown in Table 1 below.

Comparative Examples 1 to 3

In Comparative Examples 1 to 3, an etchant was prepared in the same manner as in the above described Example 1, except that the content of hydrogen fluoride, nitric acid and ammonium fluoride was changed as shown in Table 1, and furthermore, no surfactant was added, and after that, a silicon wafer was etched. The results are shown in Table 1 below.

TABLE 1

|  | hydrogen fluoride content [mol/kg] | nitric acid content [mol/kg] | ammonium fluoride content [mol/kg] | etching rate <A> for silicon thermal oxide film at 25° C. [nm/min] | etching rate <B> for tungsten film at 25° C. [nm/min] | selective ratio <B> ÷ <A> | roughness (Ra) on rear surface of silicon wafer [nm] | uniformity in etching |
|---|---|---|---|---|---|---|---|---|
| Example 1 | 1 | 5 | 3 | 79.3 | 408.5 | 5.2 | 0.42 | ⊚ |
| Example 2 | 3 | 5 | 2 | 123.2 | 656.0 | 5.3 | 0.46 | ⊚ |
| Example 3 | 5 | 5 | 3 | 213.9 | 1562.8 | 7.3 | 0.52 | ⊚ |
| Example 4 | 3 | 3 | 0.5 | 64.2 | 270.8 | 4.2 | 0.32 | ⊚ |
| Example 5 | 4 | 3 | 0.25 | 85.1 | 349.7 | 4.1 | 0.35 | ⊚ |
| Example 6 | 5 | 3 | 1 | 125.9 | 381.5 | 3.0 | 0.36 | ⊚ |
| Example 7 | 1 | 8 | 1 | 45.3 | 101.5 | 2.2 | 0.44 | ⊚ |
| Example 8 | 5 | 4 | 3 | 234.3 | 322.1 | 1.4 | 0.39 | ⊚ |
| Example 9 | 3 | 2.5 | 1 | 61.5 | 60.1 | 1.0 | 0.31 | ⊚ |
| Example 10 | 3 | 7.5 | 1 | 120.1 | 246.7 | 2.1 | 0.24 | ⊚ |
| Example 11 | 8 | 3 | 1 | 240.4 | 1416.4 | 5.9 | 0.44 | ⊚ |
| Example 12 | 1 | 4 | 0.6 | 30 | 124 | 4.1 | 0.28 | ⊚ |

TABLE 1-continued

|  | hydrogen fluoride content [mol/kg] | nitric acid content [mol/kg] | ammonium fluoride content [mol/kg] | etching rate \<A\> for silicon thermal oxide film at 25° C. [nm/min] | etching rate \<B\> for tungsten film at 25° C. [nm/min] | selective ratio \<B\> ÷ \<A\> | roughness (Ra) on rear surface of silicon wafer [nm] | uniformity in etching |
|---|---|---|---|---|---|---|---|---|
| Example 13 | 6.5 | 4 | 2 | 231.5 | 1605.3 | 6.9 | 0.45 | ◎ |
| Example 14 | 5 | 8 | 0.25 | 258.2 | 600.5 | 2.3 | 0.43 | ◎ |
| Example 15 | 9 | 2 | 0.25 | 312.2 | 442.8 | 1.4 | 0.55 | ◎ |
| Example 16 | 1 | 3 | 1.2 | 34 | 21.1 | 0.6 | 0.31 | ◎ |
| Comparative Example 1 | 3 | 3 | 3 | 129.5 | 0 | 0 | 2.3 | — |
| Comparative Example 2 | 3 | 2 | 3 | 161.2 | 0 | 0 | 3.5 | X |
| Comparative Example 3 | 8 | 1 | 4 | 513.3 | 0 | 0 | 4.2 | X |

As is clear from the above Table 1, it was confirmed that the tungsten film could not be etched with the etchant according to Comparative Examples 1 to 3. Meanwhile, the selective ratio of all of the etchants according to Examples 1 to 7 and 10 to 16 exceeded 2, and it was found that selective etching was possible for the tungsten film. In addition, as for the etchant according to Examples 8 and 9, the etching rate for the tungsten film and the etching rate for the silicon thermal oxide film exhibited approximately the same value, and thus, it was found that simultaneous etching was possible. Furthermore, all of the etchants according to Examples 1 to 16 could suppress roughness on the surface on the rear surface side of the silicon wafer, and it was confirmed that the surface was extremely smooth and clear. In addition, it was confirmed that uniform etching was possible. Here, the value for the concentration of sodium, potassium, calcium, aluminum and iron in the etchant used in Examples 1 to 16 was found using the above described ICP-MS, and it was found that no value was higher than 0.5 ppb.

Examples 17 to 19

In the present Examples 17 to 19, an etchant was prepared in the same manner as in the above described Example 7, except that the temperature for etching was changed to 15° C., 25° C. or 35° C., and after that, a silicon wafer was etched. The results are shown in Table 2 below.

TABLE 2

|  | temperature for etching [° C.] | etching rate \<A\> for silicon thermal oxide film [nm/min] | etching rate \<B\> for tungsten film [nm/min] | selective ratio \<B\> ÷ \<A\> |
|---|---|---|---|---|
| Example 17 | 15 | 53.1 | 117.7 | 2.2 |
| Example 18 | 25 | 85.1 | 349.7 | 4.1 |
| Example 19 | 35 | 141.3 | 651.8 | 4.6 |

As is clear from the above Table 2, the selective ratio exceeded 2 even when the temperature for etching was changed to 15° C., 25° C. and 35° C. As a result, it was found that the etchant according to each of Examples 17 to 19 allowed for selective etching of the tungsten film.

Example 20

In the present example 20, an etchant was prepared in the same manner as in the above described Example 1, except that the content of hydrogen fluoride and nitric acid was changed as shown in Table 3 below, and furthermore, ammonium chloride was used instead of ammonium fluoride, and after that, a silicon wafer was etched. The results are shown in Table 3 below.

TABLE 3

|  | hydrogen fluoride content [mol/kg] | nitric acid content [mol/kg] | ammonium chloride content [mol/kg] | etching rate \<A\> for silicon thermal oxide film at 25° C. [nm/min] | etching rate \<B\> for tungsten film at 25° C. [nm/min] | selective ratio \<B\> ÷ \<A\> |
|---|---|---|---|---|---|---|
| Example 20 | 6 | 2 | 2 | 101.2 | 284.1 | 2.8 |

As is clear from the above Table 3, it was found that the selective ratio exceeded 2 even in the case where ammonium chloride was used, and thus, the etchant according to Example 20 allowed for selective etching of the tungsten film.

The invention claimed is:
1. A fine treatment agent, which is used for the fine processing of a multilayer film including a tungsten containing film and a silicon compound containing film, comprising
hydrogen fluoride, nitric acid, at least one of ammonium fluoride or ammonium chloride, and 0.001 weight percent to 0.1 weight percent of a non-ionic surfactant,
wherein an etching rate for said tungsten containing film at 25° C. which is within a range from 0.5 nm/min to 5000 nm/min and an etching rate for said silicon compound containing film at 25° C. which is within a range from 0.5 times to 2 times the etching rate for said tungsten containing film at 25° C., wherein X, Y and Z satisfy the following relational expressions when the content of said hydrogen fluoride is X mol/kg the content of the nitric acid is Y mol/kg and the content of the at least one of ammonium fluoride or ammonium chloride is Z mol/kg,

[Formula 1]

$$Z \leq 1.25Y - 1.75 \quad (1)$$

$$Z > 1.4Y - 3 \quad (2)$$

$$Z \leq -0.973Y + 0.108 \times (100 - 4X) \quad (3)$$

$$0.5 \leq X \leq 10, Y > 0, 0 < Z \leq 6 \quad (4).$$

2. The fine treatment agent according to claim 1, wherein a main component of said tungsten containing film is at least one type selected from the group consisting of tungsten, titanium tungsten, copper tungsten, nickel tungsten, cobalt tungsten, molybdenum tungsten, tungsten silicide and tungsten nitride.

3. The fine treatment agent according to claim 1, wherein said silicon compound containing film is a single layer of one type selected from the group consisting of a silicon thermal oxide film, a non-doped silicate glass film, a phosphorous doped silicate glass film, a boron doped silicate glass film, a phosphorous and boron doped silicate glass film, a TEOS film, a fluorine containing silicon oxide film, a carbon containing silicon oxide film, a silicon nitride oxide film and a natural oxide film, or a multilayer film of two or more types selected from the group.

4. The fine treatment agent according to claim 1, wherein the etching rate for said silicon compound containing film at 25° C. is within a range from 0.5 nm/min to 5000 nm/min.

5. A fine treatment agent, which is used for the fine processing of multilayer film including a tungsten containing film and silicon compound containing film comprising hydrogen fluoride, nitric acid, at least one of ammonium fluoride or ammonium chloride, and 0.001 weight percent to 0.1 weight percent of a non-ionic surfactant, wherein an etching rate for said tungsten containing film at 25° C. which is within a range from 0.5 nm/min to 5000 nm/min and an etching rate for said silicon compound containing film at 25° C. which is either less than 0.5 times or greater than 2 times the etching rate for said tungsten containing film at 25° C., wherein X, Y and Z satisfy the following relational expressions when the content of said hydrogen fluoride is X mol/kg, the content of the nitric acid is Y mol/kg and the content of the at least one of ammonium fluoride or ammonium chloride is Z mol/kg,

[Formula 2]

$$Z \leq -0.973Y + 0.108 \times (100 - 4X) \quad (3)$$

$$0.5 \leq X \leq 10, Y > 0, 0 < Z \leq 6 \quad (4)$$

$$Z \leq 1.4Y - 3 \quad (5).$$

6. The fine treatment agent according to claim 5, wherein a main component of said tungsten containing film is at least one type selected from the group consisting of tungsten, titanium tungsten, copper tungsten, nickel tungsten, cobalt tungsten, molybdenum tungsten, tungsten silicide and tungsten nitride.

7. The fine treatment agent according to claim 5, wherein said silicon compound containing film is a single layer of one type selected from the group consisting of a silicon thermal oxide film, a non-doped silicate glass film, a phosphorous doped silicate glass film, a boron doped silicate glass film, a phosphorous and boron doped silicate glass film, a TEOS film, a fluorine containing silicon oxide film, a carbon containing silicon oxide film, a silicon nitride oxide film and a natural oxide film, or a multilayer film of two or more types selected from the group.

8. The fine treatment agent according to claim 5, wherein the etching rate for said silicon compound containing film at 25° C. is within a range from 0.5 nm/min to 5000 nm/min.

9. The fine treatment agent according to claim 5, wherein containing 0.001 weight percent to 0.1 weight percent of a surfactant.

10. A fine treatment method comprising: providing the fine treatment agent according to claim 5: and finely processing at least one of a tungsten containing film or a silicon compound containing film by using the fine treatment agent as an etchant.

11. A fine treatment method comprising: providing the line treatment agent according to claim 1; and finely processing at least one of a tungsten containing film or a silicon compound containing film, within a range from 5° C. to 50° C. by using the fine treatment agent as an etchant.

12. The fine treatment agent according to claim 1, which contains metal elements in an amount of no more than 1 ppb.

13. The fine treatment method according to claim 11, wherein both tungsten containing film and the silicon compound containing film are finely processed at the same time using as an etchant the fine treatment agent having an etching rate for the tungsten containing film at 25° C. which is within the range from 0.5 nm/min to 5000 mn/min and an etching rate for the silicon compound containing film at 25° C. which is within a range from 0.5 times to 2 times the etching rate for the tungsten containing film at 25° C.

14. The fine treatment method according to claim 11, wherein one of the tungsten containing film or the silicon compound containing film is predominantly finely processed using as an etchant the fine treatment agent having an etching rate for the tungsten containing film at 25° C. which is within a range from 0.5 nm/min to 5000 nm/min and an etching rate for the silicon compound containing film at 25° C. which is less than 0.5 times or more than 2 times the etching rate for the tungsten containing film at 25° C.

15. The fine treatment method according to claim 11, wherein the processing step is conducted at a temperature of 5° C. to 50° C.

* * * * *